(12) United States Patent
Brusic et al.

(10) Patent No.: US 9,343,330 B2
(45) Date of Patent: May 17, 2016

(54) COMPOSITIONS FOR POLISHING ALUMINUM/COPPER AND TITANIUM IN DAMASCENE STRUCTURES

(75) Inventors: Vlasta Brusic, Geneva, IL (US); Renjie Zhou, Brookfield, CT (US); Paul Feeney, Aurora, IL (US); Christopher Thompson, Earlville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 1007 days.

(21) Appl. No.: 11/634,576

(22) Filed: Dec. 6, 2006

(65) Prior Publication Data

US 2008/0134585 A1 Jun. 12, 2008

(51) Int. Cl.
C09K 3/14 (2006.01)
H01L 21/321 (2006.01)
C09G 1/02 (2006.01)

(52) U.S. Cl.
CPC .............. H01L 21/3212 (2013.01); C09G 1/02 (2013.01); C09K 3/1409 (2013.01); C09K 3/1436 (2013.01); C09K 3/1463 (2013.01)

(58) Field of Classification Search
CPC ...... C09G 1/02; C09K 3/1409; C09K 3/1436; C09K 3/1463; H01L 21/3212
USPC .............................. 51/307–309; 438/691–693
See application file for complete search history.

(56) References Cited

U.S. PATENT DOCUMENTS

| | | | |
|---|---|---|---|
| 5,196,353 A | 3/1993 | Sandhu et al. | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,039,891 A | 3/2000 | Kaufman et al. | |
| 6,083,840 A | 7/2000 | Mravic et al. | |
| 6,530,968 B2 | 3/2003 | Tsuchiya et al. | |
| 6,821,309 B2 | 11/2004 | Singh et al. | |
| 7,011,574 B2 | 3/2006 | Simpson et al. | |
| 7,132,058 B2 | 11/2006 | Thomas et al. | |
| 2002/0019128 A1 | 2/2002 | Lee et al. | |
| 2002/0095872 A1 | 7/2002 | Tsuchiya et al. | |
| 2003/0104770 A1 | 6/2003 | Pasqualoni et al. | |
| 2003/0124959 A1* | 7/2003 | Schroeder et al. | 451/41 |
| 2003/0139050 A1 | 7/2003 | Thomas et al. | |
| 2003/0153183 A1 | 8/2003 | Konno et al. | |
| 2003/0189186 A1* | 10/2003 | Chen et al. | 252/79.1 |
| 2003/0228763 A1* | 12/2003 | Schroeder et al. | 438/691 |
| 2004/0092102 A1 | 5/2004 | Li et al. | |
| 2004/0148867 A1 | 8/2004 | Matsumi | |
| 2004/0159050 A1 | 8/2004 | Pasqualoni et al. | |
| 2004/0216388 A1 | 11/2004 | Mathur et al. | |
| 2005/0029491 A1 | 2/2005 | Liu | |
| 2005/0056368 A1* | 3/2005 | Schroeder et al. | 156/345.12 |
| 2005/0194563 A1 | 9/2005 | Siddiqui et al. | |
| 2005/0215183 A1 | 9/2005 | Siddiqui et al. | |
| 2006/0037251 A1 | 2/2006 | Kurata et al. | |
| 2006/0046490 A1 | 3/2006 | Banerjee et al. | |

* cited by examiner

Primary Examiner — Shuangyi Abu Ali
(74) Attorney, Agent, or Firm — Thomas Omholt; Arlene Hornilla; Francis J. Koszyk

(57) ABSTRACT

The invention provides a chemical-mechanical polishing composition for polishing a substrate. The polishing composition comprises an oxidizing agent, calcium ion, an organic carboxylic acid, and water, wherein the polishing composition has a pH of about 1.5 to about 7. The invention further provides a method of chemically-mechanically polishing a substrate with the aforementioned polishing composition.

4 Claims, No Drawings

COMPOSITIONS FOR POLISHING ALUMINUM/COPPER AND TITANIUM IN DAMASCENE STRUCTURES

FIELD OF THE INVENTION

The invention pertains to chemical-mechanical polishing compositions and methods.

BACKGROUND OF THE INVENTION

Integrated circuits are made up of millions of active devices formed in or on a substrate, such as a silicon wafer. The active devices are chemically and physically connected into a substrate and are interconnected through the use of multilevel interconnects to form functional circuits. In one manufacturing process, a dielectric substrate is patterned by a conventional dry etch process to form holes and trenches for vertical and horizontal interconnects. The patterned surface is then optionally coated with a diffusion barrier layer and/or an adhesion-promoting layer, followed by deposition of a metal layer to fill the trenches and holes. Chemical-mechanical polishing (CMP) is employed to reduce the thickness of the metal layer, as well as the thickness of the diffusion barrier layer and/or adhesion-promoting layer, until the underlying dielectric layer is exposed, thereby forming the circuit device.

One way to fabricate planar metal circuit traces on a silicon dioxide substrate is referred to as the damascene process. In accordance with this process, the silicon dioxide dielectric surface having optionally a layer of silicon nitride deposited thereon is patterned by applying a photoresist, exposing the photoresist to irradiation through a pattern to define trenches and/or vias, and then using a conventional dry etch process to form holes and trenches for vertical and horizontal interconnects. The silicon nitride functions as a "hard mask" to protect the silicon dioxide surface that is not part of the trenches and/or vias from damage during etching. The patterned surface is coated with an adhesion-promoting layer such as titanium or tantalum and/or a diffusion barrier layer such as titanium nitride or tantalum nitride. The adhesion-promoting layer and/or the diffusion barrier layer are then over-coated with a metal layer. Chemical-mechanical polishing is employed to reduce the thickness of the metal over-layer, as well as the thickness of any adhesion-promoting layer and/or diffusion barrier layer, until a planar surface that exposes elevated portions of the silicon nitride surface is obtained. The vias and trenches remain filled with electrically conductive metal forming the circuit interconnects.

Tungsten and copper have been increasingly used as the electrically conductive metal. However, aluminum, which has been used in earlier generation processes to fabricate circuit interconnects via subtractive processes such as etching techniques, is now under consideration for use in damascene processes. The combination of aluminum and titanium offers potentially lower resistivity than other metal/barrier layer combinations, with corresponding potential improvement in circuit performance. However, compositions useful in the chemical-mechanical polishing of aluminum typically exhibit considerably lower removal rates in the polishing of underlying titanium. Thus, use of such polishing compositions in aluminum damascene fabrication processes to polish aluminum as well as titanium require overpolishing of aluminum remaining in circuit lines, resulting in considerable dishing of the lines. Thus, there remains in the art a need for improved compositions and methods for the chemical-mechanical polishing of substrates comprising aluminum as a conducting material and titanium as a barrier material.

BRIEF SUMMARY OF THE INVENTION

The invention provides a chemical-mechanical polishing composition comprising (a) an abrasive, (b) an oxidizing agent selected from the group consisting of peroxides, persulfates, ferric salts, and combinations thereof, (c) about 25 to about 400 ppm of calcium ion, (d) an organic carboxylic acid, and (e) water, wherein the polishing composition has a pH of about 1.5 to about 7.

The invention also provides a method of chemically-mechanically polishing a substrate, which method comprises (i) contacting a substrate with a polishing pad and a chemical-mechanical polishing composition comprising (a) an abrasive, (b) an oxidizing agent selected from the group consisting of peroxides, persulfates, ferric salts, and combinations thereof, (c) about 25 to about 400 ppm of calcium ion, (d) an organic carboxylic acid, and (e) water, wherein the polishing composition has a pH of about 1.5 to about 7, (ii) moving the polishing pad relative to the substrate with the chemical-mechanical polishing composition therebetween, and (iii) abrading at least a portion of the substrate to polish the substrate.

DETAILED DESCRIPTION OF THE INVENTION

The invention provides a chemical-mechanical polishing composition. The polishing composition comprises (a) an abrasive, (b) an oxidizing agent selected from the group consisting of peroxides, persulfates, ferric salts, and combinations thereof, (c) about 25 to about 400 ppm of calcium ion, (d) an organic carboxylic acid, and (e) water, wherein the polishing composition has a pH of about 1.5 to about 7.

Any suitable amount of abrasive can be present in the polishing composition. In an embodiment, the polishing composition can have no abrasive or substantially no abrasive. Typically, about 0.0001 wt. % or more abrasive can be present in the polishing composition (e.g., about 0.0005 wt. % or more, or about 0.001 wt. % or more, or about 0.01 wt. % or more). The amount of abrasive in the polishing composition preferably will not exceed about 10 wt. %, and more preferably will not exceed about 8 wt. %. Even more preferably the abrasive will comprise about 0.0001 wt. % to about 10 wt. % (e.g., about 0.0005 wt. % to about 5 wt. %, or about 0.001 wt. % to about 2 wt. %) of the polishing composition.

The abrasive can be any suitable abrasive, for example, the abrasive can be natural or synthetic, and can comprise metal oxide, carbide, nitride, carborundum, and the like. The abrasive also can be a polymer particle or a coated particle. The abrasive desirably comprises a metal oxide. Preferably, the metal oxide is selected from the group consisting of alumina, ceria, silica, zirconia, co-formed products thereof, and combinations thereof. More preferably, the abrasive is alumina or silica.

When the abrasive is alumina, the alumina can be any suitable form of alumina. Preferably, the alumina is fumed alumina or $\alpha$-alumina. When the abrasive is $\alpha$-alumina, at least a portion of the surface of the $\alpha$-alumina can be coated with a negatively-charged polymer or copolymer. For example, about 5 wt. % or more (e.g., about 10 wt. % or more, or about 50 wt. % or more, or substantially all, or all) of the surface of the $\alpha$-alumina can be coated with a negatively-charged polymer or copolymer. The negatively-charged polymer or copolymer can be any suitable polymer or copolymer. Preferably, the negatively-charged polymer or copolymer comprises repeating units selected from the group consisting of carboxylic acid, sulfonic acid, and phosphonic acid functional groups. More preferably, the anionic polymer comprises repeating units selected from the group consisting of acrylic acid, methacrylic acid, itaconic acid, maleic acid, maleic anhydride, vinyl sulfonic acid, 2-(methacryloyloxy) ethanesulfonic acid, styrene sulfonic acid, 2-acrylamido-2-methylpropane sulfonic acid, vinylphosphonic acid, 2-(methacroyloxy)ethylphosphate, and combinations thereof. Most preferably, the negatively-charged polymer or copolymer is selected from the group consisting of poly(2-acrylamido-2-methylpropane sulfonic acid) and polystyrenesulfonic acid. Since particles of α-alumina typically have a positively-charged surface, the association of the polymer or copolymer with particles of α-alumina results in deprotonation of at least part of the acidic functional groups on the polymer or copolymer, thus rendering the polymer or copolymer negatively-charged in association with the particles.

The polishing composition can comprise any suitable amount of alumina. Typically, the polishing composition comprises about 0.0001 wt. % or more (e.g., about 0.0005 wt. % or more, or about 0.001 wt. % or more, or about 0.01 wt. % or more) of alumina. Preferably, the polishing composition comprises about 10 wt. % or less (e.g., about 5 wt. % or less, or about 2 wt. % or less) of alumina. Even more preferably, the polishing composition comprises about 0.0001 wt. % to about 10 wt. % (e.g., about 0.0005 wt. % to about 5 wt. %, or about 0.001 wt. % to about 2 wt. %) of alumina.

When the abrasive is silica, the silica can be any suitable form of silica, such as fumed silica or precipitated silica. Preferably, the silica is a condensation-polymerized silica. Condensation-polymerized silica includes silica prepared by sol-gel processes and by hydrothermal processes. Non-limiting examples of suitable silica include commercially available products from Eka Chemicals (Bindzil silicas), Nissan Chemical (Snowtex silicas), Nyacol Nano Technologies (NexSil silicas), and Cabot Corporation (Cab-o-Sperse fumed silicas).

The polishing composition can comprise any suitable amount of silica. Generally, the polishing composition comprises about 0.001 wt. % or more (e.g., about 0.01 wt. % or more, or about 0.1 wt. % or more) of silica. Typically, the polishing composition comprises about 20 wt. % or less (e.g., about 10 wt. % or less) of silica. Preferably, the polishing composition comprises about 0.1 wt. % to about 10 wt. % (e.g., about 0.25 wt. % to about 7.5 w.t %, or about 0.5 wt. % to about 5 wt. %) of silica.

The abrasive comprises particles that typically have an average particle size (e.g., average particle diameter) of about 20 nm to about 500 nm. In the context of the invention, average particle size refers to the average size of the smallest sphere that encloses the particle. Preferably, the abrasive particles have an average particle size of about 30 nm to about 400 nm (e.g., about 40 nm to about 300 nm, or about 50 nm to about 200 nm).

The abrasive desirably is suspended in the polishing composition, more specifically in the water component of the polishing composition. When the abrasive is suspended in the polishing composition, the abrasive preferably is colloidally stable. The term colloid refers to the suspension of abrasive particles in the liquid carrier. Colloidal stability refers to the maintenance of that suspension over time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). The value of $[B]-[T]/[C]$ desirably is less than or equal to 0.3, and preferably is less than or equal to 0.1.

The polishing composition comprises an oxidizing agent selected from the group consisting of peroxides, persulfates, ferric salts, and combinations thereof. The function of the oxidizing agent is to oxidize at least a part of a substrate, such as a layer or layers comprising aluminum, an alloy of aluminum such as aluminum-copper, or titanium. Non-limiting examples of peroxides include hydrogen peroxide and its adducts such as urea hydrogen peroxide, percarbonates, and perborates. Non-limiting examples of suitable persulfates include ammonium persulfate, sodium persulfate, and potassium persulfate. Non-limiting ferric salts include ferric nitrate, ferric chloride, and ferric sulfate. Preferably, the oxidizing agent is selected from the group consisting of hydrogen peroxide, ammonium persulfate, ferric nitrate, and combinations thereof.

The polishing composition can comprise any suitable amount of oxidizing agent. Generally, the polishing composition comprises about 0.01 wt. % or more (e.g., about 0.1 wt. % or more) of oxidizing agent. Typically, the polishing composition comprises about 10 wt. % or less (e.g., about 5 wt. % or less) of oxidizing agent.

The polishing composition typically comprises about 25 ppm or more (e.g., about 30 ppm or more, or about 40 ppm or more, or about 50 ppm or more) of calcium ion. Preferably, the polishing composition comprises about 400 ppm or less (e.g., about 350 ppm or less, or about 300 ppm or less, or about 250 ppm or less, or even about 200 ppm or less) of calcium ion. More preferably, the polishing composition comprises about 25 ppm to about 400 ppm (e.g., about 30 ppm to about 350 ppm, or about 40 ppm to about 300 ppm, or even about 50 ppm to about 200 ppm) of calcium ion. Advantageously, the presence of calcium ion provides for enhancement of the removal rate of titanium layers exhibited by the inventive polishing composition. The calcium ion contained in the polishing composition can be provided by any suitable source of calcium ion. Preferably, the calcium ion contained in the polishing composition is provided by at least one water-soluble calcium salt. Non-limiting examples of suitable calcium salts include calcium acetate and calcium chloride, hydrates thereof, and combinations thereof.

The polishing composition comprises an organic carboxylic acid. Organic carboxylic acids useful in the polishing composition include dicarboxylic and tricarboxylic acids and their salts. The organic carboxylic acid can further comprise functional groups selected from the group consisting of hydroxyl, carbonyl, and halogen. Preferably, the organic carboxylic acid is selected from the group consisting of citric acid, malonic acid, succinic acid, tartaric acid, salts thereof, and combinations thereof. More preferably, the organic carboxylic acid is succinic acid.

It will be appreciated that the aforementioned carboxylic acids can exist in the form of a salt (e.g., a metal salt, an ammonium salt, or the like), an acid, or as a partial salt thereof. For example, succinates include succinic acid, as well as mono- and di-salts thereof.

The polishing composition can comprise any suitable amount of the organic carboxylic acid. Generally, the polishing composition comprises about 0.1 wt. % or more (e.g., about 0.5 wt. % or more) of the organic carboxylic acid. Typically, the polishing composition comprises about 10 wt. % or less (e.g., about 5 wt. % or less) of the organic carboxylic acid. Preferably, the polishing composition comprises about 0.5 wt. % to about 5 wt. % and more preferably about 1 wt. % to about 4 wt. % of the organic carboxylic acid.

The polishing composition has a pH of about 7 or less (e.g., about 6 or less). Preferably, the polishing composition has a pH of about 1 or more (e.g., about 1.5 or more, or about 2 or more). Even more preferably, the polishing composition has a pH of about 2 to about 6 (e.g., about 3 to about 5). The polishing composition optionally comprises pH adjusting agents, for example, potassium hydroxide, ammonium hydroxide, alkylammonium hydroxides, and/or nitric acid. The polishing composition can optionally comprise pH buffering systems, for example, ammonium acetate or monosodium citrate. Many such pH buffering systems are well known in the art.

The polishing composition optionally further comprises one or more other additives. Such additives include any suitable surfactant and/or rheological control agent, including viscosity enhancing agents and coagulants (e.g., polymeric rheological control agents, such as, for example, urethane polymers), acrylates comprising one or more acrylic subunits (e.g., vinyl acrylates and styrene acrylates), and polymers, copolymers, and oligomers thereof, and salts thereof. Suitable surfactants include, for example, cationic surfactants, anionic surfactants, anionic polyelectrolytes, nonionic surfactants, amphoteric surfactants, fluorinated surfactants, mixtures thereof, and the like.

The polishing composition optionally further comprises a biocide. The biocide can be any suitable biocide, for example an isothiazolinone biocide. The amount of biocide used in the polishing composition typically is about 1 ppm to about 500 ppm, and preferably is about 10 ppm to about 200 ppm.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, oxidizing agent, etc.) as well as any combination of ingredients (e.g., abrasive, oxidizing agent, calcium ion, organic carboxylic acid, etc.).

For example, the oxidizing agent, calcium ion, and organic carboxylic acid can be dissolved in water by addition of the oxidizing agent, calcium ion, and organic carboxylic acid to water in any order, or even simultaneously. The abrasive can then be added and dispersed by any method that is capable of dispersing the abrasive in the polishing composition. The polishing composition can be prepared prior to use, with one or more components, such as the oxidizing agent, added to the polishing composition shortly before use (e.g., within about 1 minute before use, or within about 1 hour before use, or within about 7 days before use). The pH can be adjusted at any suitable time, and is preferably adjusted prior to the addition of the abrasive to the polishing composition. The polishing composition also can be prepared by mixing the components at the surface of the substrate during the polishing operation.

The polishing composition also can be provided as a concentrate which is intended to be diluted with an appropriate amount of water and typically the oxidizing agent prior to use. If the oxidizing agent is a liquid, an appropriate volume of the oxidizing agent can be added to the water prior to dilution of the concentrate with the water, or an appropriate volume of the oxidizing agent can be added to the concentrate before, during, or after addition of the water to the concentrate. If the oxidizing agent is a solid, the oxidizing agent can be dissolved in the water or a portion thereof before dilution of the concentrate with the water and/or an aqueous solution of the oxidizing agent. A solid oxidizing agent also can be added as a solid to the concentrate before, during, or after dilution of the concentrate with the water to provide the polishing composition. The oxidizing agent can be incorporated into the polishing composition by any suitable method capable of incorporating the oxidizing agent into the polishing composition, such as by mixing.

The polishing composition concentrate can comprise an abrasive, calcium ion, a carboxylic acid, and water in amounts such that, upon dilution of the concentrate with an appropriate amount of water and oxidizing agent, each component of the polishing composition will be present in the polishing composition in an amount within the appropriate range recited above for each component. For example, the abrasive, calcium ion, and carboxylic acid can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively) and an appropriate amount of oxidizing agent, each component will be present in the polishing composition in an amount within the ranges set forth above for each component. Preferably, the water-soluble components present in the concentrate, such as the calcium ion and the carboxylic acid, will be present in amounts such that the components are fully dissolved in the water of the concentrate, and in amounts such that the concentration of the water-soluble components in the concentrate, more specifically in the water of the concentrate, is less than the maximum solubility of the water-soluble components in the water of the concentrate at ambient conditions (e.g., at a temperature of about 20° C.). Furthermore, the concentrate can contain an appropriate fraction of the water, along with optionally some or all of the oxidizing agent, present in the final polishing composition in order to ensure that the abrasive, oxidizing agent (if present), calcium ion, carboxylic acid, and other suitable additives are at least partially or fully dissolved in the concentrate, preferably fully dissolved in the concentrate.

The invention further provides a method of chemically-mechanically polishing a substrate comprising (i) contacting a substrate with a polishing pad and the polishing composition described herein, (ii) moving the polishing pad relative to the substrate with the polishing composition therebetween, and (iii) abrading at least a portion of the substrate to polish the substrate.

Although the polishing composition of the invention is useful for polishing any substrate, the polishing composition is particularly useful in the polishing of a substrate comprising at least one metal layer comprising aluminum or an aluminum-containing alloy such as aluminum-copper, at least one metal layer comprising titanium, and at least one dielectric layer. The titanium can be in the form of titanium metal, alloys thereof, nitrides thereof, and combinations thereof. The dielectric layer can be a metal oxide, porous metal oxide, glass, organic polymer, fluorinated organic polymer, or any other suitable high or low-k insulating layer, and preferably is a silicon-based metal oxide, more preferably a silicon oxide layer derived from tetraethylorthosilicate (TEOS).

The substrate can be any suitable substrate (e.g., an integrated circuit, metals, ILD layers, semiconductors, and thin films). Typically the substrate comprises a patterned dielectric layer having a barrier layer comprising titanium deposited thereon and an overcoating layer comprising aluminum. The polishing process will first remove the bulk of the overlying aluminum layer and then will begin removing the underlying titanium layer with aluminum still available to the polishing system. Towards the end of the polishing process, the dielectric layer will be exposed to the polishing composition. Advantageously, the inventive method allows for control of the selectivity for the polishing of the aluminum, titanium, and dielectric layers. Selectivity is defined herein as the ratio of the polishing rate of one layer compared to the polishing rate of a second, different layer.

The polishing composition of the invention is capable of polishing (e.g., planarizing) substrates comprising at least one aluminum layer, at least one titanium layer, and at least one dielectric layer with desirable removal rates, low erosion, and low dishing. In the context of the invention the term "layer" refers both to a continuous, bulk layer of material having a substantially homogeneous surface and to a surface comprising the material contained within a surface feature (e.g., a circuit line or a via). The relative selectivities for the polishing of aluminum, titanium, and dielectric layers can be controlled by selection of the abrasive (i.e., either alumina or silica) and by varying the amounts of the components present in the polishing composition.

When the inventive polishing composition comprises alumina, the removal rates observed for polishing of dielectric layers are low relative to aluminum and titanium, and thus the alumina-containing inventive polishing composition is "self-stopping" on the dielectric layer. The aluminum removal rate and the titanium removal rate for the inventive alumina-containing polishing composition can be controlled by selecting the amount of oxidizing agent and by controlling the pH of the polishing composition. In particular, the inventive alumina-containing polishing composition having a lower content of the oxidizing agent and a lower pH exhibits a higher selectivity for the polishing of aluminum as compared to titanium than the inventive alumina-containing polishing composition having a higher content of the oxidizing agent and a higher pH. In this regard, selectivity for the polishing of aluminum as compared to titanium refers to the ratio of the removal rate for aluminum to the removal rate for titanium exhibited by the polishing composition. Typically, the aluminum layer will overcoat the titanium layer so that the polishing process will first remove the bulk of the overlying aluminum layer and then will begin removing the underlying titanium layer with aluminum residing within the substrate feature(s) still available to the polishing system. When both aluminum and titanium are available to the polishing system, if the rate of aluminum polishing is significantly greater than the rate of titanium polishing, the aluminum layer can be overpolished, which leads to dishing and/or erosion of the aluminum layer. Thus, by increasing the pH and the content of oxidizing agent in the alumina-containing polishing composition, the rate of aluminum removal can be decreased relative to the rate of titanium removal, thereby reducing the extent of overpolishing of the aluminum layer residing in the circuit lines.

When the inventive polishing composition comprises silica, the polishing composition exhibits higher removal rates for titanium as compared to aluminum. The silica-containing embodiments are thus useful in removal of titanium-containing barrier layers while exhibiting reduced dishing and/or erosion of aluminum-containing circuit lines. Additionally, increasing the amount of silica in the polishing composition enhances the removal rate exhibited with respect to dielectric layers, thereby allowing for efficient planarization of the dielectric layers after barrier layer removal.

The polishing method of the invention is particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a substrate being polished enables the determination of the polishing endpoint, i.e., the determination of when to terminate the polishing process with respect to a particular substrate.

The following examples further illustrate the invention but, of course, should not be construed as in any way limiting its scope.

In each of these examples, the polishing experiments generally involved the use of a commercially available polishing apparatus equipped with a concentric groove pad over a sub-pad. The polishing parameters generally were 20.7 kPa (3 psi) downforce pressure of the substrate against the polishing pad, 50 rpm platen speed, 53 rpm carrier speed, and 180 mL/min polishing composition flow rate, except for Example 1. In Example 1, the platen speed was 90 rpm and the carrier speed was 93 rpm.

Example 1

This example demonstrates the effect of calcium ion on the removal rates exhibited by the inventive polishing composition in the polishing of separate substrates comprising aluminum-copper and titanium.

Eight similar sets of two substrates, each of which substrates separately comprised aluminum-copper and titanium, were polished with eight different polishing compositions (Polishing Compositions 1A-1H). Each of the compositions comprised 0.56 wt. % of α-alumina treated with a negatively-charged polymer, 1.12 wt. % of succinic acid, and 3 wt. % of hydrogen peroxide, at a pH of 3.5 in water. The polishing compositions further comprised calcium ion, provided by calcium acetate hydrate, in an amount as recited in Table 1.

Following polishing, the removal rates (RR) for aluminum-copper and titanium were determined for each of the polishing compositions, and the results are summarized in Table 1.

TABLE 1

| Polishing Composition | Calcium Ion (ppm) | Al—Cu RR (Å/min) | Ti RR (Å/min) |
|---|---|---|---|
| 1A (comparative) | 0 | 1071 | 246 |
| 1B (invention) | 30 | 1103 | 243 |
| 1C (invention) | 50 | 910 | 378 |
| 1D (invention) | 80 | 963 | 356 |
| 1E (invention) | 100 | 1000 | 356 |
| 1F (invention) | 150 | 953 | 419 |
| 1G (invention) | 200 | 547 | 336 |

As is apparent from the results set forth in Table 1, increasing the amount of calcium ion from none (Polishing Composition 1A) to 150 ppm (Polishing Composition 1F) resulted in an increase in the removal rate for titanium of about 70%. Further increasing the amount of calcium ion to 200 ppm (Polishing Composition 1G) resulted in a removal rate for titanium less than the removal rate observed at 150 ppm but greater than the removal rate with no calcium ion, and also resulted in reduction of the removal rate for aluminum-copper as compared with the removal rate observed for polishing compositions with lesser amounts, or no, calcium ion. Thus, the results of this example demonstrate the dependence of aluminum-copper and titanium removal rates on the amount of calcium ion in the polishing composition of the invention.

Example 2

This example demonstrates the effect of the amount of organic carboxylic acid on the removal rates for the polishing of separate substrates comprising aluminum-copper, titanium, and a silicon oxide dielectric material generated from tetraethylorthosilicate exhibited by the polishing composition of the invention. The silicon oxide dielectric material is referred to as "TEOS" herein.

Two similar sets of two substrates, each of which substrates separately comprised aluminum-copper, titanium, and TEOS, were polished with two different polishing compositions (Polishing Compositions 2A and 2B). Each of the compositions comprised 0.56 wt. % of silica (Bindzil CJ2-2, Eka Chemicals) and 3% of hydrogen peroxide. Polishing Composition 2A further comprised 1.38 wt. % of succinic acid, while Polishing Composition 2B further comprised 3.38 wt. % of succinic acid.

Following polishing, the removal rates (RR) for aluminum-copper, titanium, and TEOS were determined for each of the polishing compositions, and the results are summarized in Table 2.

TABLE 2

| Polishing Composition | Al—Cu RR (Å/min) | Ti RR (Å/min) | TEOS RR (Å/min) | Selectivity (Ti RR/Al—Cu RR) |
|---|---|---|---|---|
| 2A | 1293 | 1504 | 161 | 1.16 |
| 2B | 1482 | 1932 | 244 | 1.30 |

As is apparent from the results set forth in Table 2, increasing the amount of succinic acid from 1.38 wt. % (Polishing Composition 2A) to 3.38 wt. % (Polishing Composition 2B) resulted in an increase in the removal rate for aluminum-copper of about 15% but resulted in a greater increase in the titanium removal rate of about 28%. The removal rate for TEOS increased about 51% but remained about 16% and about 13% of the removal rates of aluminum-copper and titanium, respectively. In addition, the selectivity, as defined by the ratio of the titanium removal rate to the aluminum-copper removal rate, increased from 1.16 to 1.30 upon increase in the amount of succinic acid present in the inventive polishing composition.

Example 3

This example demonstrates the effect of the amount of silica on the removal rates for polishing of separate substrates comprising aluminum-copper, titanium, and a silicon oxide dielectric material generated from tetraethylorthosilicate exhibited by the polishing composition of the invention.

Two similar sets of two substrates, each of which substrates separately comprised aluminum-copper, titanium, and TEOS, were polished with two different polishing compositions (Polishing Compositions 3A and 3B). Each of the compositions comprised 3.38 wt. % of succinic acid and 3% of hydrogen peroxide. Polishing Composition 3A further comprised 0.56 wt. % of silica (Bindzil CJ2-2, Eka Chemicals), while Polishing Composition 3B further comprised 5.56 wt. % of the same silica.

Following polishing, the removal rates (RR) for aluminum-copper, titanium, and TEOS were determined for each of the polishing compositions, and the results are summarized in Table 2.

TABLE 3

| Polishing Composition | Al—Cu RR (Å/min) | Ti RR (Å/min) | TEOS RR (Å/min) | Selectivity Al—Cu/ TEOS | Selectivity Ti/TEOS |
|---|---|---|---|---|---|
| 3A | 1482 | 1932 | 244 | 6.07 | 7.92 |
| 3B | 2788 | 3344 | 1750 | 1.59 | 1.91 |

As is apparent from the results set forth in Table 3, increasing the amount of silica present in the polishing composition from 0.56 wt. % to 5.56 wt. % resulted in increases in the removal rates observed for aluminum-copper, titanium, and TEOS of about 88%, 73%, and 617%, respectively. The selectivity for the polishing of aluminum-copper as compared with TEOS, as defined by the ratio of the aluminum-copper removal rate to the TEOS removal rate, decreased from 6.07 to 1.59 with the increase in silica content of the polishing composition. Similarly, the selectivity for the polishing of titanium as compared with TEOS, as defined by the ratio of the titanium removal rate to the TEOS removal rate, decreased from 7.92 to 1.91 with the increase in silica content of the polishing composition.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
(a) an abrasive, wherein the abrasive is polymer-treated alumina comprising alumina treated with a negatively-charged polymer, wherein the negatively-charged polymer is poly(2-acrylamido-2-methylpropane sulfonic acid),
(b) an oxidizing agent selected from the group consisting of peroxides, persulfates, ferric salts, and combinations thereof,
(c) 50 to 200 ppm of calcium ion,
(d) about 1 wt. % to about 4 wt. % of an organic carboxylic acid, wherein the organic carboxylic acid is selected from the group consisting of citric acid, malonic acid, succinic acid and tartaric acid, and
(e) water,
wherein the polishing composition has a pH of 2 to 6.

2. The polishing composition of claim 1, wherein the polishing composition comprises 0.001 wt. % to 2 wt. % of abrasive.

3. The polishing composition of claim 1, wherein the oxidizing agent is selected from the group consisting of hydrogen peroxide, ammonium persulfate, ferric nitrate, and combinations thereof.

4. The polishing composition of claim 3, wherein the polishing composition comprises 0.1 wt. % to 5 wt. % of oxidizing agent.

* * * * *